United States Patent
Sako

(10) Patent No.: US 7,652,934 B2
(45) Date of Patent: Jan. 26, 2010

(54) SEMICONDUCTOR MEMORY DEVICE

(75) Inventor: Atsumasa Sako, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 313 days.

(21) Appl. No.: 11/896,223

(22) Filed: Aug. 30, 2007

(65) Prior Publication Data

US 2008/0068916 A1   Mar. 20, 2008

(30) Foreign Application Priority Data

Sep. 19, 2006   (JP) .............................. 2006-252900

(51) Int. Cl.
*G11C 5/14* (2006.01)
(52) U.S. Cl. .................. 365/189.09; 365/227
(58) Field of Classification Search ............ 365/189.09, 365/227, 226
See application file for complete search history.

(56) References Cited

U.S. PATENT DOCUMENTS

| | | | |
|---|---|---|---|
| 5,510,749 A * | 4/1996 | Arimoto | ...................... 327/546 |
| 5,530,640 A | 6/1996 | Hara et al. | |
| 6,229,740 B1 * | 5/2001 | Ogura | .................... 365/189.11 |
| 6,683,809 B2 * | 1/2004 | Matsuda et al. | ........ 365/185.18 |
| 6,865,118 B2 * | 3/2005 | Kwon | .................... 365/189.09 |
| 2006/0044054 A1 | 3/2006 | Yamazaki et al. | |

FOREIGN PATENT DOCUMENTS

| | | |
|---|---|---|
| JP | 10-012838 | 1/1998 |
| JP | 2000-353386 | 12/2000 |
| JP | 2006-066018 | 3/2006 |

\* cited by examiner

*Primary Examiner*—Anh Phung
(74) *Attorney, Agent, or Firm*—Arent Fox LLP.

(57) ABSTRACT

In addition to a booster power supply circuit boosting a power supply voltage to supply a boost voltage VPP to a memory core, cell capacitors composing a stabilization capacitor, and a bias generation circuit supplying a midpoint potential to a connection point of the cell capacitors, further, a clamp circuit reducing the boost voltage to a set value is provided, in which when the booster power supply circuit stops a boosting operation, the clamp circuit cramps the boost voltage to the set value, so that the midpoint potential can be prevented from largely deviating to a boosting voltage side and a ground potential side in a transition to a normal operation thereafter.

18 Claims, 6 Drawing Sheets

F I G. 1
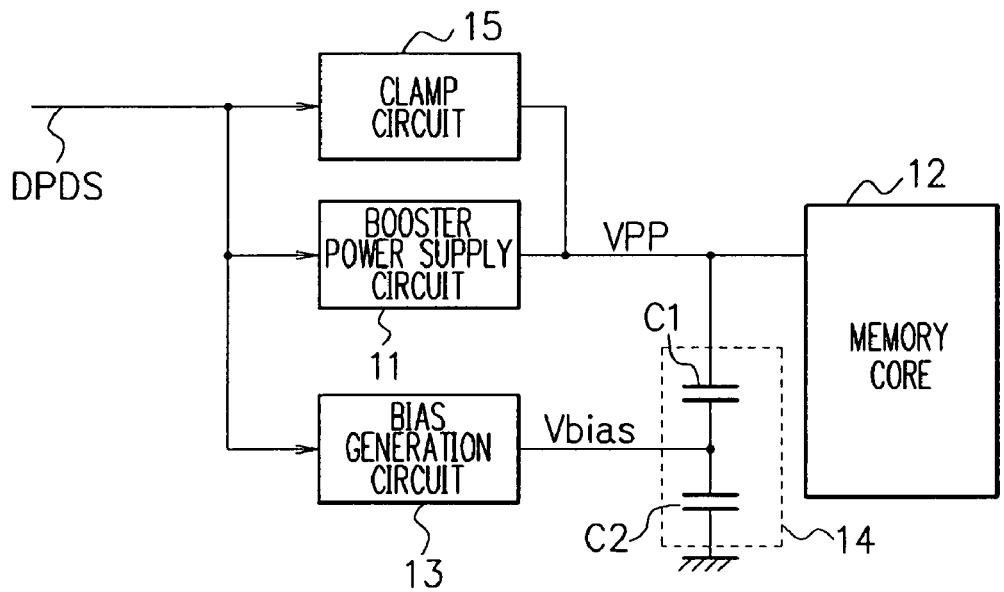
F I G. 2
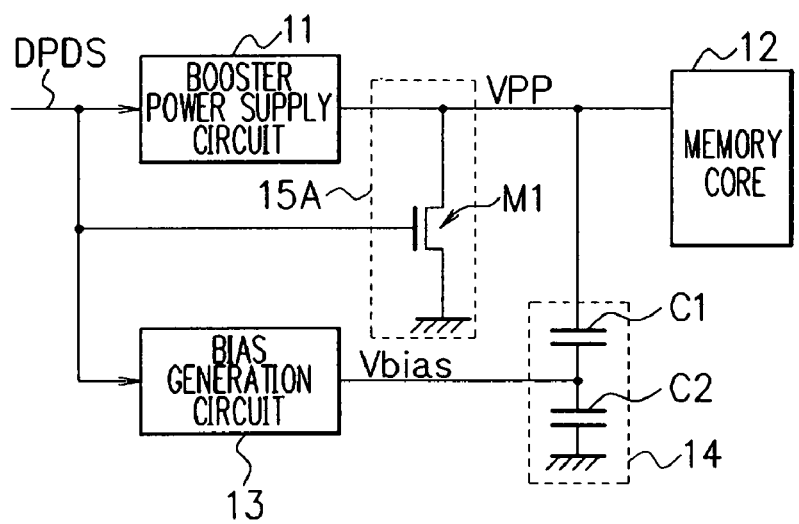

SEMICONDUCTOR MEMORY DEVICE

CROSS-REFERENCE TO RELATED APPLICATIONS

This application is based upon and claims the benefit of priority from the prior Japanese Patent Application No. 2006-252900, filed on Sep. 19, 2006, the entire contents of which are incorporated herein by reference.

BACKGROUND OF THE INVENTION

1. Field of the Invention

The present invention relates to a semiconductor memory device, and particularly to, a semiconductor memory device suitable for use in a semiconductor memory device having a low power consumption state in which power consumption is lower than that in a normal operation.

2. Description of the Related Art

In semiconductor memory devices such as a DRAM (Dynamic Random Access Memory) and the like, a stabilization capacitor (decoupling capacitor) is provided between a power supply line and a ground line to suppress variation in power supply voltage, in general. It is under study that the stabilization capacitor is formed by a cell capacitor used for a memory cell of the DRAM. For instance, in Japanese Patent Application Laid-Open No. Hei10-12838 (Patent document 1), there is described a capacitance element realized with good area efficiency by arranging a plurality of cell capacitors in a mutually isolated manner.

However, since the cell capacitor of the DRAM has a low limit value (capacitor withstand voltage) with respect to an applied voltage, it is unusable as it is as a stabilization capacitor for a high-voltage power supply. Accordingly, to cope with the high-voltage power supply, the plurality of cell capacitors are connected in series between a high-voltage power supply line and the ground line to thereby divide the voltage, and a circuit giving a certain midpoint potential to connection point(s) of the cell capacitors is provided to suppress the voltage applied to each cell capacitor not to exceed the capacitor's withstand voltage. For instance, in Japanese Patent No. 3399519 (Patent document 2) and Japanese Patent Application Laid-Open No. 2006-66018 (Patent document 3), there are described stabilization capacitors formed by connecting a plurality of cell capacitors in series and keeping midpoint(s) of connection point(s) of the cell capacitors.

FIG. 8 is a view showing a configuration of the conventional semiconductor memory device provided with the stabilization capacitor formed by the plurality of cell capacitors connected in series. In FIG. 8, a circuit portion related to a power supply in the semiconductor memory device is shown.

The description will be given of a case where a low power consumption state signal DPDS is low level (hereinafter denoted by "L"), namely a case other than a low power consumption mode (Deep Power Down: DPD, also called as a power down mode) being a state in which the power consumption is reduced to lower than that in the normal operation. A booster power supply circuit 101 boosts a power supply voltage VDD supplied by a not-shown external power supply to supply a boost voltage VPP to a memory core 102.

A stabilization capacitor 104 to suppress variation in the boost voltage VPP is formed by cell capacitors C1, C2. Each of the cell capacitors C1, C2 is composed of a plurality of cell capacitors. The boost voltage VPP is supplied to a first electrode of the cell capacitor C1, a midpoint potential Vbias is supplied to the connection point of a second electrode of the cell capacitor C1 and a first electrode of the cell capacitor C2, and a second electrode of the cell capacitor C2 is grounded.

A bias generation circuit 103 controls the midpoint potential Vbias to be supplied to the connection point of the cell capacitors C1, C2. The bias generation circuit 103 detects the boost voltage VPP to control the midpoint potential Vbias so that the voltages applied to the cell capacitors C1, C2 do not exceed the capacitor withhold voltages.

Subsequently, the description will be given of a case where the low power consumption state signal DPDS is high level (hereinafter denoted by "H"), namely a case it is in the low power consumption mode. In order to reduce power consumption, the booster power supply circuit 101 stops its operation of boosting the external voltage VDD and a supply line (power supply line) of the boost voltage VPP becomes floating. In the same manner, the bias generation circuit 103 stops its operation as well, and a supply line of the midpoint potential Vbias becomes floating.

The description will be given of the operation of the conventional semiconductor memory device shown in FIG. 8 in detail with reference to FIG. 9. Hereinafter, the cell capacitors C1, C2 are assumed to have the same capacitance.

In a start-up, (time period S1), the booster power supply circuit 101 and the bias generation circuit 103 receive the low power consumption state signal DPDS of "L". The booster power supply circuit 101 boosts the power supply voltage VDD supplied from the external power supply to boost the boost voltage VPP to be supplied to the memory core 102 to a predetermined voltage. The midpoint potentials Vbias at the cell capacitors C1, C2 composing the stabilization capacitor 104 of the boost voltage VPP become voltage-divided levels of the boost voltage VPP. Since the cell capacitors C1; C2 have the same capacitance, the midpoint potential Vbias increases in a following manner at the half (½) level of the increased voltage of the boost voltage VPP. The bias generation circuit 103 operates to make the midpoint potential Vbias be (VPP/2).

In a normal operation (time period S2), the booster power supply circuit 101 and the bias generation circuit 103 receive the low power consumption state signal DPDS of "L". The booster power supply circuit 101 boosts the power supply voltage VDD to keep the boost voltage VPP at the predetermined voltage. The midpoint voltage of the cell capacitors C1, C2 comes to (VPP/2) being the voltage-divided boost voltage VPP, so that the bias generation circuit 103 operates to make the midpoint potential Vbias be (VPP/2).

In a low power consumption mode (time period S3), the booster power supply circuit 101 and the bias generation circuit 103 receive the low power consumption state signal DPDS of "H". The booster power supply circuit 101 and the bias generation circuit 103 having received the low power consumption state signal DPDS of "H" stop operation to reduce the power consumption, so that the respective supply lines of the boost voltage VPP and the midpoint potential Vbias become floating. The midpoint potential Vbias of the cell capacitors C1, C2 comes to (VPP/2) being the voltage-divided boost voltage VPP.

After that, in the low power consumption mode, the boost voltage VPP gradually lowers toward the ground potential due to leak current of the memory core 102. Further, the midpoint potential Vbias gradually lowers as well at the level of (VPP/2).

In the transition from the low power consumption mode to the normal operation (time period S4) the booster power supply circuit 101 and the bias generation circuit 103 receive the low power consumption state signal DPDS of "L" to start their operations. The booster power supply circuit 101 boosts the power supply voltage VDD to increase the boost voltage VPP to the predetermined voltage. The midpoint potential Vbias of the cell capacitors C1, C2 increases in a following manner at a half (½) level of the increased voltage of the boost voltage VPP. The bias generation circuit 103 operates to make the midpoint potential Vbias be (VPP/2).

After that, when the boost voltage VPP has come to the predetermined voltage and the midpoint potential Vbias has come to (VPP/2), the normal operation starts. In this normal operation (time period S5), they operate in the same manner as in the previously described normal operation (time period S2)

In the conventional semiconductor memory devices, the midpoint potential Vbias is controlled to be kept by the bias generation circuit 103 in the start-up and normal operation. However, in the low power consumption mode, in which the bias generation circuit 103 stops and does not operate, so that the midpoint potential Vbias may come close to the boost voltage VPP as shown for example in FIG. 10. In FIG. 10, "S1" denotes the start-up and "S2" denotes the normal operation time. In addition, "S3" denotes the low power consumption time, "S4" denotes the transition from the low power consumption mode to the normal operation, and "S5" denotes the normal operation time (this applies similarly to FIG. 11, which will be described later).

After that, in the transition (S4) from the low power consumption mode to the normal operation, the booster power supply circuit 101 receives the low power consumption state signal DPDS to boost the external voltage VDD to increase the boost voltage VPP to the predetermined voltage, while the bias generation circuit 103 operates to increase the midpoint potential Vbias to (VPP/2). Therefore, the midpoint potential Vbias of the cell capacitors C1, C2 increases from the voltage in the low power consumption mode to the half (½) of the increase in the boost voltage VPP, so that the midpoint potential Vbias sometimes deviates largely from the midpoint potential Vbias at the time of the normal operation. At that time, should the voltage applied to the cell capacitor C2 come to a large voltage V1 larger than the capacitor withstand voltage, there arise problems that the cell capacitor C2 is broken, the leak current increases, and the like, affecting reliability.

Further, in the low power consumption mode, for example, the midpoint potential Vbias sometimes comes close to a ground potential as shown in FIG. 11.

After that, in the transition (S4) from the low power consumption mode to the normal operation, the booster power supply circuit 101 receives the low power consumption state signal DPDS to boost the external voltage VDD to increase the boost voltage VPP to the predetermined voltage, while the bias generation circuit 103 operates to increase the midpoint potential Vbias to (VPP/2). The midpoint potential Vbias of the cell capacitors C1, C2 increases from the voltage in the low power consumption mode to the half (½) of the increase in the boost voltage VPP, so that the midpoint potential Vbias sometimes deviates largely from the midpoint potential Vbias at the time of the normal operation. At that time, should the voltage applied to the cell capacitor C1 come to a large voltage V2 larger than the capacitor withstand voltage, there arise problems that the cell capacitor C1 is broken, the leak current increases, and the like, affecting reliability.

Thus, in the conventional semiconductor memory devices, due to the variation in the midpoint potential Vbias in the transition from the low power consumption mode to the normal operation, the voltages over the capacitor withstand voltages are sometimes applied, respectively, to the cell capacitors C1, C2 composing the stabilization capacitor 104.

SUMMARY OF THE INVENTION

An object of the present invention is to enable to control a midpoint potential of a connection point of a plurality of cell capacitors connected in series and composing a stabilization capacitor.

A semiconductor memory device of the present invention includes: a booster power supply circuit boosting a first power supply voltage to supply a second power supply voltage to the memory core section having a plurality of memory cells; a plurality of capacitors connected in series between a power supply line supplying the second power supply voltage and a ground; a bias generation circuit supplying a midpoint potential to connection point(s) of the capacitors connected in series; and a clamp circuit clamping the second power supply voltage to a set value when the booster power supply circuit stops a boosting operation.

According to the present invention, when the booster power supply circuit stops the boosting operation, the clamp circuit clamps the second power supply voltage to the set value, so that the midpoint potential can be prevented from deviating largely to the second power supply voltage side and the ground potential side in the transition to the normal operation thereafter.

BRIEF DESCRIPTION OF THE DRAWINGS

FIG. 1 is a block diagram showing an experimental feature of a semiconductor memory device according to an embodiment of the present invention;

FIG. 2 is a view showing an experimental feature of a semiconductor memory device according to a first embodiment of the present invention;

DETAILED DESCRIPTION OF THE PREFERRED EMBODIMENTS

Figure 3:
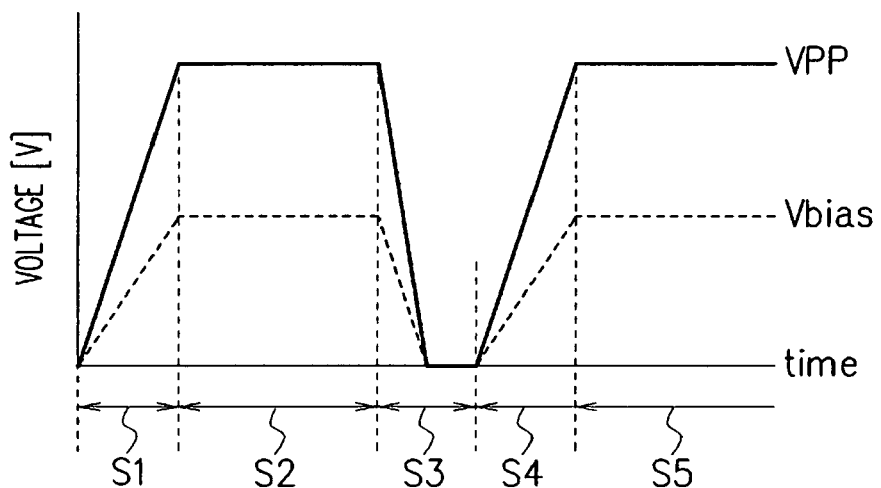
FIG. 3 is a view showing voltage variations in accordance with respective states in the first embodiment.

Hereinafter, embodiments of the present invention are described based on the drawings.

FIG. 1 is a view showing a configuration example of a semiconductor memory device according to an embodiment of the present invention and showing only an experimental feature of the present invention.

A booster power supply circuit 11 boosts a power supply voltage VDD supplied from a not-shown external power supply to supply a boost voltage VPP to a memory core 12. Here, the memory core 12 is, for example, a memory core of a DRAM type as will be described later, and has a plurality of memory cells formed by cell capacitors (memory cell capacitors).

A stabilization capacitor 14 is to suppress variation in the boost voltage VPP and is formed by cell capacitors C1, C2. The cell capacitors C1, C2 are formed by using the same cell capacitor as used for the memory cell, respectively. The boost voltage VPP is supplied to a first electrode of the cell capacitor C1, a second electrode of the cell capacitor C1 and a first electrode of the cell capacitor C2 are connected, and a second electrode of the cell capacitor C2 is grounded. In other words, the cell capacitors C1, C2 composing the stabilization capacitor 14 are connected in series between a supply line (power supply line) and the ground. Further, a midpoint potential Vbias is supplied to the connection point of the second electrode of the cell capacitor C1 and the first electrode of the cell capacitor C2.

A bias generation circuit 13 detects the boost voltage VPP to control the midpoint potential Vbias so that the voltages applied to the cell capacitors C1, C2 do not exceed capacitor withstand voltages. The midpoint potential Vbias is a potential, for example, of such a boost voltage VPP that is voltage divided in accordance with the capacitance ratio between the cell capacitors C1, C2, and when the capacitance ratio therebetween is the same, the midpoint potential Vbias comes to VPP/2 (or approximately VPP/2).

A clamp circuit 15 is a circuit to reduce the boost voltage VPP to a set value, namely a circuit clamping the supply line (power supply line) supplying the boost voltage VPP to a predetermined potential.

The booster power supply circuit 11, the bias generation circuit 13, and the clamp circuit 15 are supplied with a low power consumption state signal DPDS indicating either a low power consumption mode (power down mode) being a state in which the power consumption is reduced to lower than that in the normal operation or not. In the present embodiments, it is assumed that, when the low power consumption state signal DPDS is a high level ("H"), it is in the low power consumption mode, and when the low power consumption state signal DPDS is a low level ("L"), it is not in the low power consumption mode (for example, it is in the normal operation state). The operations of the booster power supply circuit 11, the bias generation circuit 13, and the clamp circuit 15 are controlled in accordance with the low power consumption state signal DPDS.

Specifically, when the low power consumption state signal DPDS is "L", the booster power supply circuit 11 boosts the power supply voltage VDD supplied from the external power supply to supply the boost voltage VPP and the bias generation circuit 13 detects the boost voltage VPP to control the midpoint potential Vbias. When the low power consumption state signal DPDS is "L", the clamp circuit 15 does not perform the clamping operation.

Meanwhile, when the low power consumption state signal DPDS is "H", namely when it is in the low power consumption mode, the booster power supply circuit 11 and the bias generation circuit 13 stop operations and their outputs become floating. Further, when the low power consumption state signal DPDS is "H", the clamp circuit 15 operates to clamp the boost voltage VPP to the determined voltage. In other words, when the low power consumption state signal DPDS is "H", the supply line of the midpoint potential Vbias becomes the floating, and the boost voltage VPP is clamped to the set voltage by the clamp circuit 15.

First Embodiment

The description will be given of a first embodiment of the present invention.

FIG. 2 is a view showing a configuration example of a semiconductor memory device according to the first embodiment. In FIG. 2, the same block and so forth as shown in FIG. 1 are denoted by the same numerical references as of FIG. 1 and the redundant description thereof will be omitted.

In the semiconductor memory device according to the first embodiment, a clamp circuit 15A is composed of a switching circuit connected between the supply line of the boost voltage VPP and the ground. Specifically, the clamp circuit 15A is formed by a n-channel MOS transistor (hereinafter called the "nMOS transistor") M1. A drain of the nMOS transistor M1 is connected to the supply line of the boost voltage VPP and a source thereof is grounded. Further, the low power consumption state signal DPDS is supplied to a gate of the nMOS transistor M1.

When the low power consumption state signal DPDS is "H", the nMOS transistor M1 is put into an ON state and the boost voltage VPP is short-circuited to the ground (the boost voltage VPP is clamped to a gourd potential). Meanwhile, when the low power consumption state signal DPDS is "L", the nMOS transistor M1 is put into an OFF state to perform no clamp operation to the boost voltage VPP.

The operation of the semiconductor memory device according to the first embodiment will be described with reference to FIG. 3. Hereinafter, the cell capacitors C1, C2 are assumed to have the same capacitance.

In a start-up, (time period S1), the booster power supply circuit 11, the bias generation circuit 13, and the clamp circuit 15A receive the low power consumption state signal DPDS of "L". The booster power supply circuit 11 boosts the power supply voltage VDD supplied from the external power supply to boost the boost voltage VPP to be supplied to the memory core 12 to the predetermined voltage. The midpoint potentials Vbias at the cell capacitors C1, C2 composing the stabilization capacitor 14 of the boost voltage VPP become such levels of the boost voltage VPP that are voltage divided in accordance with the capacitance ratio between the cell capacitors C1, C2. Since the cell capacitors C1, C2 have the same capacitance, the midpoint potential Vbias increases in a following manner at a half (½) level of the increased voltage of the boost voltage VPP. The bias generation circuit 13 operates to make the midpoint potential Vbias be (VPP/2). The clamp circuit 15A does not perform the clamp operation of the boost voltage VPP in that the low power consumption state signal DPDS is "L" in which the nMOS transistor MI is put into the OFF state.

In the normal operation, (time period S2), the booster power supply circuit 11, the bias generation circuit 13, and the clamp circuit 15A receive the low power consumption state signal DPDS of "L". The booster power supply circuit 11 boosts the power supply voltage VDD to keep the boost voltage VPP at the predetermined voltage. Further, the midpoint voltage of the cell capacitors C1, C2 comes to (VPP/2) being the voltage-divided boost voltage VPP, so that the bias generation circuit 13 operates to make the midpoint potential Vbias be (VPP/2). The clamp circuit 15A does not perform the clamping operation of the boost voltage VPP.

In a low power consumption mode (time period S3), the booster power supply circuit 11, the bias generation circuit 13, and the clamp circuit 15A receive the low power consumption state signal DPDS of "H". The booster power supply circuit 11 stops its operation to reduce the power consumption. The nMOS transistor M1 is put into the ON state, and the clamp circuit 15A clamps the boost voltage VPP to the ground potential. The midpoint potential Vbias of the cell capacitors C1, C2 comes to the ground potential since the boost voltage VPP is the ground potential. Further, the bias generation circuit 13 stops its operation to reduce the power consumption and the supply line of the midpoint potential Vbias becomes floating.

Subsequently, in a transition, (time period S4) from the low power consumption mode to the normal operation, the booster power supply circuit 11, the bias generation circuit 13, and the clamp circuit 15A receive the low power consumption state signal DPDS of "L". Accordingly, the booster power supply circuit 11 and the bias generation circuit 13 start their operations, respectively, and the clamp circuit 15A does not perform the clamping operation. The booster power supply circuit 11 boosts the power supply voltage VDD to increase the boost voltage VPP to the predetermined voltage. The midpoint potential Vbias of the cell capacitors C1, C2 increases in a following manner at the half (½) level of the increase in the boost voltage VPP. The bias generation circuit 13 operates to make the midpoint potential Vbias be (VPP/2).

After that, when the boost voltage VPP has come to the predetermined voltage and the midpoint potential Vbias has come to (VPP/2), the normal operation starts. In this normal operation (time period S5), they operate in the same manner as in the previously described normal operation (time period S2).

As described above, according to the first embodiment, the clamp circuit 15A clamps the boost voltage VPP to the ground potential in the low power consumption mode, so that the boost voltage VPP and the midpoint potential Vbias increase in voltage together from the ground potential in the transition from the low power consumption mode to the normal operation. Therefore, the midpoint potential Vbias comes to (VPP/2) without deviating to the boost voltage VPP side nor the ground potential side. Accordingly, the midpoint potential Vbias can be controlled appropriately so as not to apply the voltage over the capacitor withstand voltages to the cell capacitors C1, C2, so that problems such as a cell capacitor breakage, a leak current increase, and so on can be prevented from arising and reliability can be ensured.

Second Embodiment

Subsequently, the description will be given of a second embodiment according to the present invention.

Figure 4:
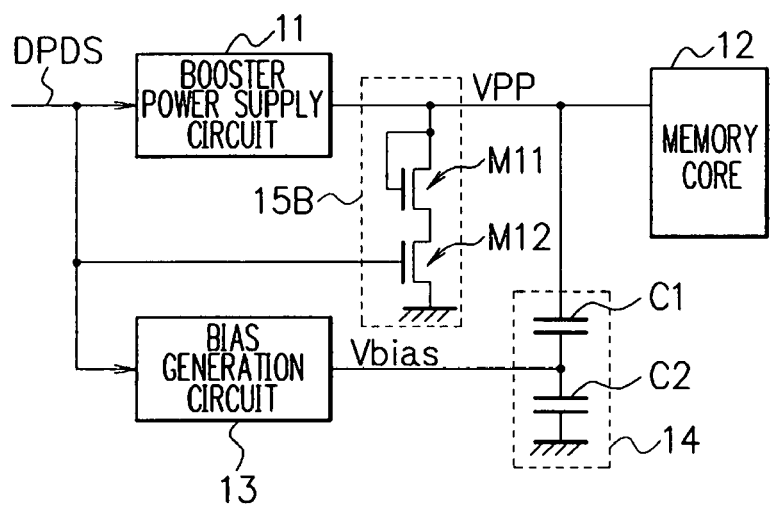
FIG. 4 is a view showing an experimental feature of an a semiconductor memory device according to a second embodiment of the present invention.

FIG. 4 is a view showing a configuration example of a semiconductor memory device according to the second embodiment. In FIG. 4, the same block and so forth as shown in FIG. 1 are denoted by the same numerical references as of FIG. 1 and the redundant description thereof will be omitted.

In the semiconductor memory device according to the second embodiment, a clamp circuit 15B is composed of two nMOS transistors M11, M12 as shown in FIG. 4. A drain and a gate of the nMOS transistor M11 are connected to the supply line of the boost voltage VPP, and a source thereof is connected to a drain of the nMOS transistor M12. Specifically, the nMOS transistor M11 is diode-connected. A source of the nMOS transistor M12 is grounded and the low power consumption state signal DPDS is supplied to a gate thereof.

When the low power consumption state signal DPDS is "H", the nMOS transistor M12 is put into the ON state and the source of the diode-connected nMOS transistor M11 is short-circuited to the ground, so that the boost voltage VPP is short-circuited to a threshold voltage Vth of the nMOS transistors (the boost voltage VPP is clamped to the voltage Vth). Meanwhile, when the low power consumption state signal DPDS is "L", the nMOS transistor M12 is put into the OFF state to perform no clamp operation.

Figure 5A:
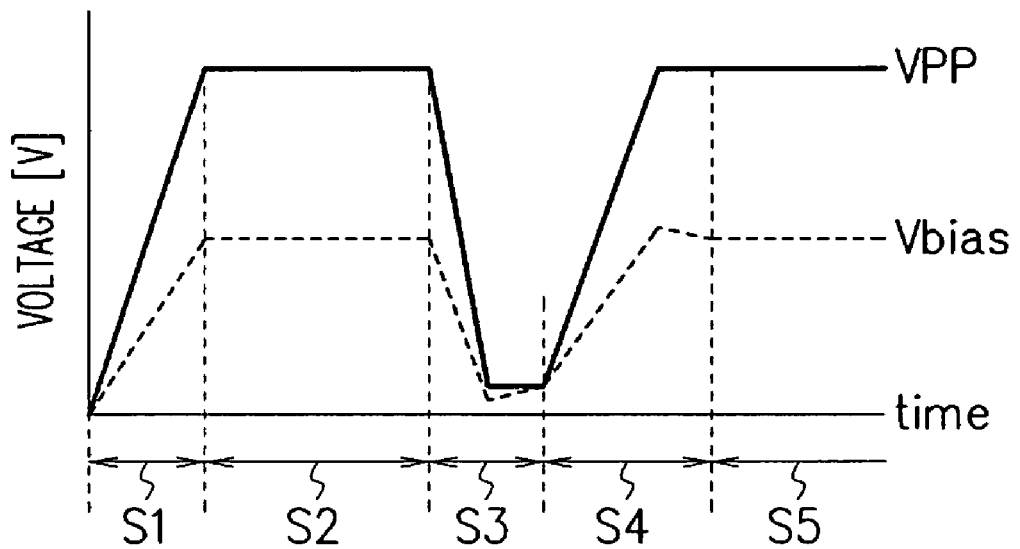
FIGS. 5A and 5B are views showing voltage variations in accordance with respective states in the second embodiment.

The operation of the semiconductor memory device according to the second embodiment will be described with reference to FIG. 5A. Note that the cell capacitors C1, C2 are assumed to have the same capacitance. In FIG. 5A, a case where the midpoint potential Vbias comes close to the boost voltage VPP in the low power consumption mode in which the bias generation circuit 13 stops operating, is shown.

In the start-up (time period S1), the booster power supply circuit 11, the bias generation circuit 13, and the clamp circuit 15B receive the low power consumption state signal DPDS of "L". The booster power supply circuit 11 boosts the power supply voltage VDD supplied from the external power supply to boost the boost voltage VPP to be supplied to the memory core 12 to the predetermined voltage. The midpoint potentials Vbias at the cell capacitors C1, C2 composing the stabilization capacitor 14 of the boost voltage VPP comes to voltage divided levels of the boost voltage VPP. The midpoint potentials Vbias at the cell capacitors C1, C2 composing the stabilization capacitor 14 of the boost voltage VPP become such levels of the boost voltage VPP that are voltage divided. Since the cell capacitors C1, C2 have the same capacitance, the midpoint potential Vbias increases in a following manner at the half (½) level of the increased voltage of the boost voltage VPP. The bias generation circuit 13 operates to make the midpoint potential Vbias be (VPP/2). The clamp circuit 15B does not perform the clamping operation of the boost voltage VPP since the low power consumption state signal DPDS is "L".

In the normal operation (time period S2), the booster power supply circuit 11, the bias generation circuit 13, and the clamp circuit 15B receive the low power consumption state signal DPDS of "L". The booster power supply circuit 11 boosts the power supply voltage VDD to keep the boost voltage VPP at the predetermined voltage. The midpoint voltage of the cell capacitors C1, C2 comes to (VPP/2) being the voltage-divided boost voltage VPP, so that the bias generation circuit 13 operates to make the midpoint potential Vbias be (VPP/2). The clamp circuit 15B does not perform the clamping operation of the boost voltage VPP.

In the low power consumption mode (time period S3), the booster power supply circuit 11, the bias generation circuit 13, and the clamp circuit 15B receive the low power consumption state signal DPDS of "H". The booster power supply circuit 11 stops its operation to reduce the power consumption, while the clamp circuit 15B performs the clamping operation to clamp the boost voltage VPP to the threshold voltage Vth of the nMOS transistors. The midpoint potential Vbias of the cell capacitors C1, C2 comes to (Vth/2) being such a boost voltage VPP as voltage divided into (½). Further, the bias generation circuit 13 stops its operation to reduce the power consumption and the supply line of the midpoint potential Vbias becomes floating.

Here, in the start-up and normal operation, the midpoint potential Vbias is controlled to be kept by the bias generation circuit 13, while, in the example shown in FIG. 5A, there is shown a case where, in the low power consumption mode, the midpoint potential Vbias comes close to the threshold voltage Vth of the nMOS transistors being the same as the boost voltage VPP as time goes on.

In the transition (time period S4) from the low power consumption mode to the normal operation, the booster power supply circuit 11, the bias generation circuit 13, and the clamp circuit 15A receive the low power consumption state signal DPDS of "L". Accordingly, the booster power supply circuit 11 and the bias generation circuit 13 start their operations, respectively, and the clamp circuit 15B does not perform the clamping operation. The booster power supply circuit 11 boosts the power supply voltage VDD to increase the boost voltage VPP to the predetermined voltage. The midpoint potential Vbias of the cell capacitors C1, C2 increases in a following manner at the half (½) level of the increase in the boost voltage VPP. The bias generation circuit 13 operates to make the midpoint potential Vbias be (VPP/2).

At this time, since the midpoint potential Vbias of the cell capacitors C1, C2 increases in voltage from the threshold voltage Vth of the nMOS transistors, the following is satisfied: Vth+(VPP−Vth)/2=VPP/2+Vth/2. Specifically, the midpoint potential Vbias of the cell capacitors C1, C2 in the transition from the low power consumption mode to the normal operation comes to substantially (½) of the boost voltage VPP.

After that, when the boost voltage VPP has come to the predetermined voltage and the midpoint potential Vbias has come to (VPP/2), the normal operation starts. In this normal operation (time period S5), they operate in the same manner as in the previously described normal operation (time period S2).

Figure 5B:
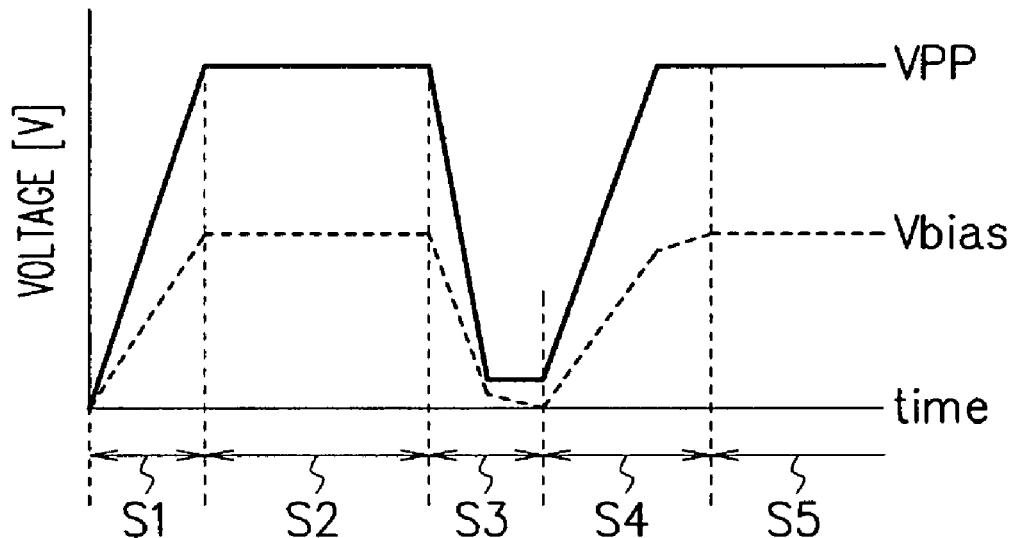

The description will be given of another operation example of the semiconductor memory device according to the second embodiment with reference to FIG. 5B. Note that the cell capacitors C1, C2 are assumed to have the same capacitance. In FIG. 5B, a case where the midpoint potential Vbias comes close to the ground potential in the low power consumption mode in which the bias generation circuit 13 stops operating, is shown.

The operations in the start-up (time period S1), the normal operation (time period S2), and the low power consumption mode (time period S3) are the same as already described with reference to FIG. 5A, and the description thereof will be omitted. Note that, however, in the example shown in FIG. 5B, it is assumed that the midpoint potential Vbias comes to the ground potential as time goes on in the low power consumption mode.

In the transition (time period S4) from the low power consumption mode to the normal operation, the booster power supply circuit 11, the bias generation circuit 13, and the clamp circuit 15B receive the low power consumption state signal DPDS of "L". The booster power supply circuit 11 boosts the power supply voltage VDD to increase the boost voltage VPP to the predetermined voltage. The midpoint potential Vbias of the cell capacitors C1, C2 increases in a following manner at the half (½) level of the increased voltage of the boost voltage VPP. The bias generation circuit 13 operates to make the midpoint potential Vbias be (VPP/2). The clamp circuit 15B does not perform the clamping operation.

At this time, since the midpoint potential Vbias of the cell capacitors C1, C2 increases in voltage from the ground potential, the following is satisfied: (VPP−Vth)/2=VPP/2−Vth/2. Specifically, the midpoint potential Vbias of the cell capacitors C1, C2 in the transition from the low power consumption mode to the normal operation comes to substantially (½) of the boost voltage VPP.

After that, when the boost voltage VPP has come to the predetermined voltage and the midpoint potential Vbias has come to (VPP/2), the normal operation starts. In this normal operation (time period S5), they operate in the same manner as in the normal operation (time period S2).

According to the second embodiment, the clamp circuit 15B clamps the boost voltage VPP to the threshold voltage Vth of the nMOS transistors in the low power consumption mode, so that the midpoint potential Vbias in the transition from the low power consumption mode to the normal operation comes to substantially (VPP/2) without largely deviating to the boost voltage VPP side nor the ground potential side. Accordingly, the midpoint potential Vbias can be controlled appropriately so as not to apply the voltage over the capacitor withstand voltages to the cell capacitors C1, C2, so that the problems such as the cell capacitor breakage, the leak current increase, and so on can be prevented from arising and the reliability can be ensured.

Overall Configuration of Semiconductor Memory Device of Present Embodiment

Figure 6:
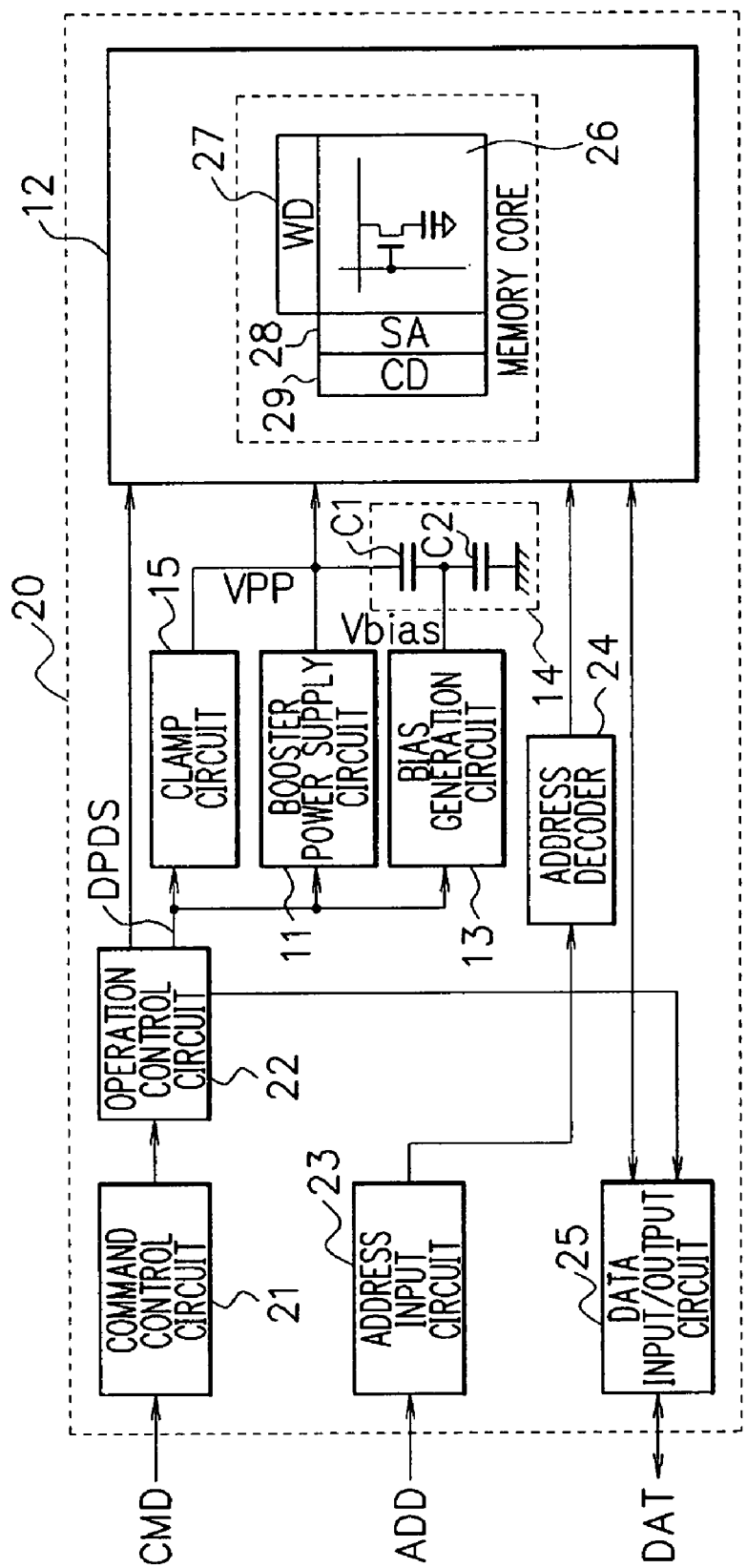
FIG. 6 is a block diagram showing an example configuration the semiconductor memory device according to the embodiment of the present invention.

FIG. 6 is a block diagram showing an example of overall configuration of the semiconductor memory device according to the embodiment of the present invention. In FIG. 6, the same block and so forth as shown in FIG. 1 are denoted by the same numerical references as of FIG. 1.

A semiconductor memory device 20 according to the present invention includes: a command control circuit 21, an operation control circuit 22, an address input circuit 23, an address decoder 24, a data input/output circuit 25, the booster power supply circuit 11, the memory core 12, the bias generation circuit 13, the stabilization capacitor 14 and the clamp circuit 15.

The command control circuit 21 receives chip enable signals/CE1, CE2, an output enable signal/OE, and a write enable signal/WE, as an external command CMD. The command control circuit 21 deciphers the external command CMD received and the decipherment result is outputted to the operation control circuit 22 as an internal command signal. As a command indicated by the internal command signal, there are a read command, a write command, a low power consumption mode, and the like. For instance, the semiconductor memory device 20 can be put into the low power consumption mode by setting the chip enable signals CE2 composing the external command CMD to "L", and the semiconductor memory device 20 can be put into the normal operation mode by setting the chip enable signals CE2 composing the external command CMD to "H".

The operation control circuit 22 generates a timing signal to perform an read operation, a write operation or a refresh operation, or the low power consumption state signal DPDS to the memory core 12, in accordance with the internal command signal (the read command, the write command, the low power consumption mode command, or the like) or a refresh command generated inside the semiconductor memory device 20. Further, when the read command or the write command, each of which is the internal command signal, and the refresh command generated inside are competitive, the operation control circuit 22 includes a (not-shown) arbiter arbitrating these commands. Note that the refresh command is generated periodically by a not-shown refresh timer.

The timing signal generated by the operation control circuit 22 is supplied to the memory core 12, the data input/output circuit 25 and the like. Further, the low power consumption state signal DPDS generated by the operation control circuit 22 is supplied to the booster power supply circuit 11, the bias generation circuit 13, the clamp circuit 15, and the like.

The address input circuit 23 receives an external address signal ADD via an address terminal to supply the external address signal ADD received to the address decoder 24. The address decoder 24 decodes the external address signal ADD supplied from the address input circuit 23 to output the decoded signal to the memory core 12.

In the read operation, the data input/output circuit 25 outputs the read data, which is transferred from the memory core 12 via a common data bus, as a data signal DAT via an external data terminal. Further, in the write operation, the data input/output circuit 25 receives a write data to be inputted as a data signal DAT via the external data terminal to transfer the write data received to the memory core 12 via the common data bus. The data input/output operation in the data input/output circuit 25 is performed based on the timing signal from the operation control circuit 22.

The booster power supply circuit 11 receives the low power consumption state signal DPDS from the operation control circuit 22, and when the low power consumption state signal DPDS is "L", namely when it is not in the low power consumption mode, then the booster power supply circuit 11 boosts the power supply voltage VDD supplied from the not-shown power supply to increase the boost voltage VPP to be supplied to the memory core 12. Meanwhile, when the low power consumption state signal DPDS is "H", namely it is in the low power consumption mode, the booster power supply circuit 11 stops its boosting operation of the power supply voltage VDD.

The memory core 12 is the memory core of the DRAM type and includes a memory cell array 26, a word decoder 27, a sense amplifier 28 and a column decoder 29. The memory cell array 26 includes a plurality of memory cells (dynamic memory cells) arranged in arrays, in which each cell includes a transfer transistor and a cell capacitor to memorize data. Further, the memory cell array 26 includes a word line connected to a gate of the transfer transistor in the each memory cell and a bit line connected to a data input/output node of the transfer transistor.

The word decoder 27 selects any word line from among a plurality of the word lines in accordance with a raw decoded signal of the decoded signal supplied. The sense amplifier 28 amplifies the signal amount of the data read from the memory cell via the bit line, for example, in the read operation. The column decoder 29 transmits the read data, which is read out to the bit line and amplified by the sense amplifier 28, to the common data bus or otherwise outputs a control signal controlling a column switch to transmit the write data supplied via the common data bus to the bit line, in accordance with a column decoded signal of the decoded signal supplied.

The stabilization capacitor 14 is to suppress the variation in the boost voltage VPP, and is composed of the plurality of cell capacitors C1, C2 connected in series between the supply line (power supply line) supplying the boost voltage VPP and the ground. The cell capacitors C1, C2 are formed, respectively, by using the same cell capacitor as used for the memory cell.

The bias generation circuit 13 receives the low power consumption state signal DPDS from the operation control circuit 22, and when the low power consumption state signal DPDS is "L" (it is not in the low power consumption mode), the bias generation circuit 13 controls the midpoint potential Vbias to be applied to the connection point of the cell capacitors C1, C2 of the stabilization capacitor 14 so that the voltages applied to the cell capacitors C1, C2 do not exceed the capacitor withstand voltages. Meanwhile, when the low power consumption state signal DPDS is "H" (it is in the low power consumption mode), the bias generation circuit 13 does not operate.

The clamp circuit 15 receives the low power consumption state signal DPDS from the operation control circuit 22 and does not operate when the low power consumption state signal DPDS is "L" (it is not in the low power consumption mode). Meanwhile, the clamp circuit 15 clamps the boost voltage VPP to the set value when the low power consumption state signal DPDS is "H" (it is in the low power consumption mode).

Note that, in the above-described respective embodiments, the midpoint potential Vbias supplied to the connection point of the cell capacitors C1, C2 composing the stabilization capacitor 14 and connected in series is assumed to have a potential being such a boost voltage VPP that is voltage divided in accordance with the capacitance ratio between the cell capacitors C1, C2; however, the midpoint potential Vbias is not limited thereto. Any potential is acceptable as long as the potential suppresses the voltage applied to the cell capacitors C1, C2 not to exceed their respective capacitor withstand voltages, and when the withstand voltages of the cell capacitors C1, C2 are defined as VC1, VC2, respectively, then the midpoint potential Vbias is acceptable when it satisfies both $(VPP-Vbias) \leqq VC1$ and $Vbias \leqq VC2$.

Further, in the above-described embodiments, the stabilization capacitor 14 is composed of the two cell capacitors C1, C2, however, the number is not limited to two, and the stabilization capacitor 14 may be composed of two or more cell capacitors connected in series. In that case, it is all right when the midpoint potential Vbias is supplied appropriately to the connection points of the respective cell capacitors composing the stabilization capacitor 14 and the respective midpoint potentials Vbias are appropriately controlled by the bias generation circuit 13.

Subsequently, the description will be given of a cell-phone unit applying an electronic device including the semiconductor memory device according to the above-described embodiment and a CPU (control device) supplying the external command CMD to the semiconductor memory device and capable of controlling the operating state of the semiconductor memory device.

Figure 7:
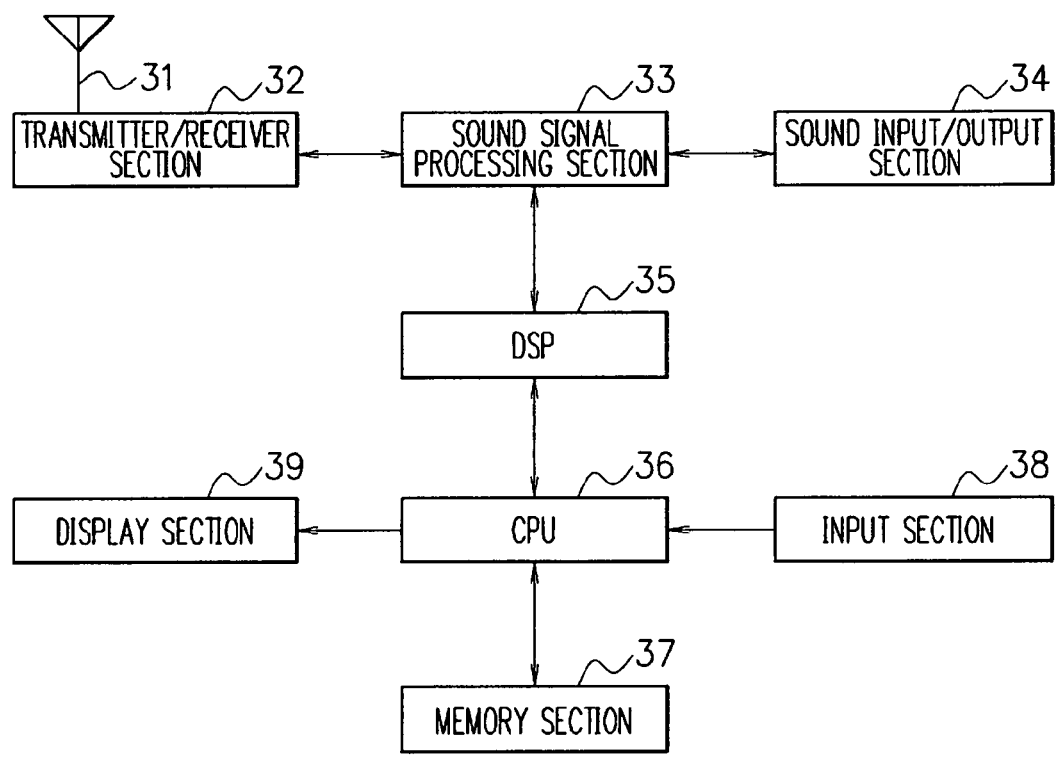
FIG. 7 is a block diagram showing a configuration example of a cell-phone unit applying an electronic device according to the embodiment of the present invention.
Figure 8:
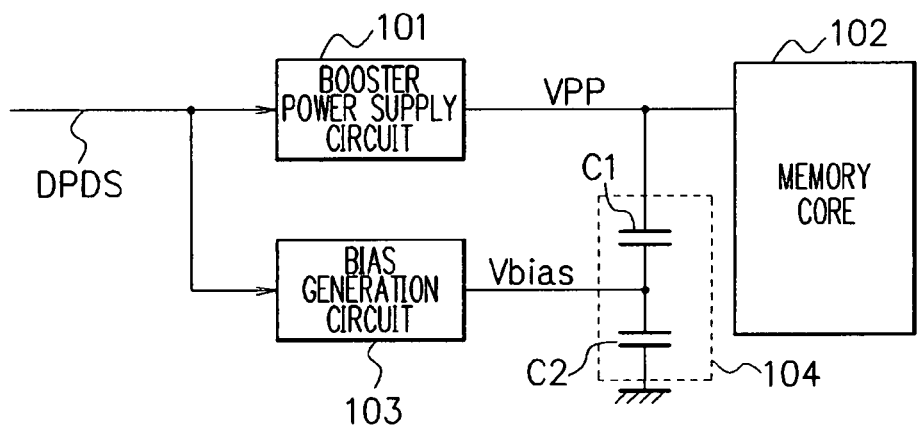
FIG. 8 is a view showing a configuration of a conventional semiconductor memory device.
Figure 9:
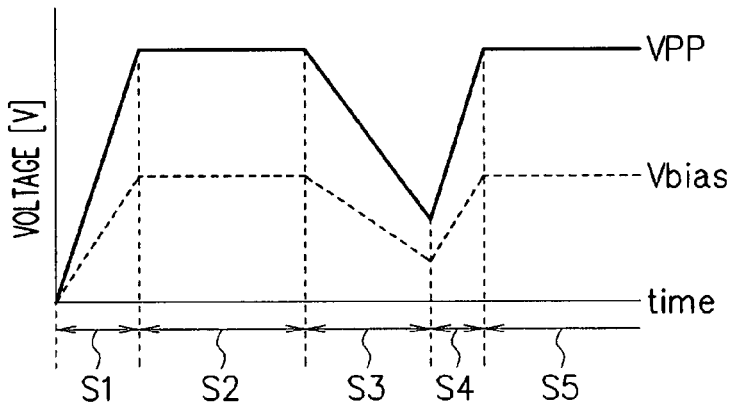
FIG. 9 is a view showing voltage variations in accordance with respective states in the conventional semiconductor memory device.
Figure 10:
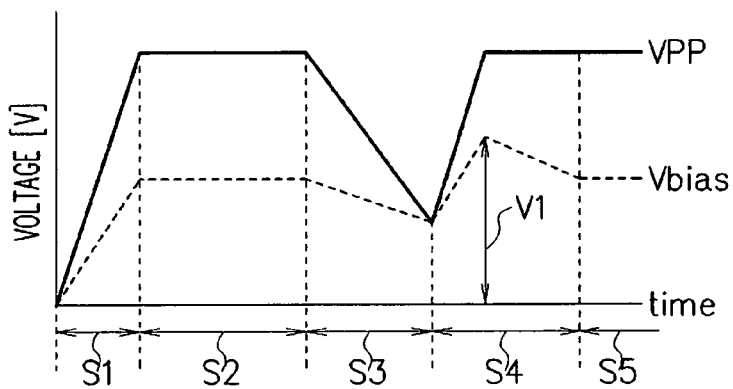
FIG. 10 is a view to illustrate a problem of the conventional semiconductor memory device.
Figure 11:
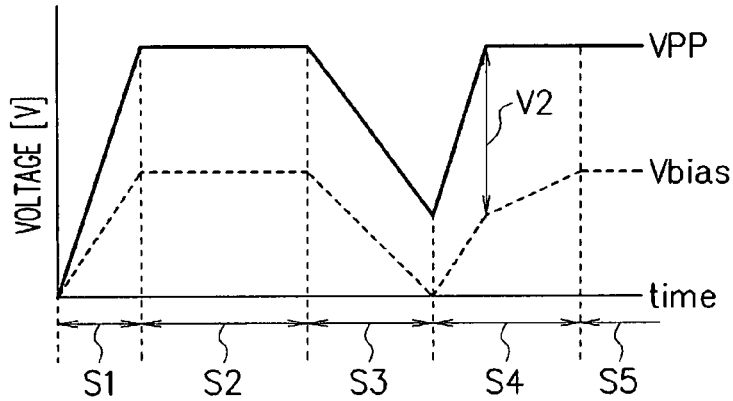
FIG. 11 is a view to illustrate a problem of the conventional semiconductor memory device.

FIG. 7 is a block diagram showing a configuration example of the cell-phone unit applying the electronic device according to the present embodiment. The present cell-phone unit is composed basically in the same manner as in the conventional cell-phone unit, and includes: a transmitter/receiver section 32 provided with an antenna 31, a sound signal processing section 33 sorting the data into a modulation of a transmitting signal, a demodulation of a receiving signal and sound, a sound input/output section 34 inputting/outputting the sound, a DSP (Digital Signal Processor) 35 performs a process related to a coding of the transmitting data and a decoding of the received data, a CPU 36 realizing respective functions by comprehensively controlling transmission/reception and respective functional sections, a memory section 37 storing a processing program, the received data and the like, an input section 38 inputting a telephone number, instructive operation, and the like, and a display section 39 displaying the data.

The memory section 37 is composed of the semiconductor memory device 20 according to the embodiment of the present invention, including: the booster power supply circuit 11, the memory core, the bias generation circuit 13, the stabilization capacitor 14 composed of the cell capacitors, and the clamp circuit 15. In the memory section 37, the external command CMD is supplied from the CPU 36 and the operation mode (operating state) of the memory core 12 is controlled by the external command CMD. For instance, in the memory section 37, the write and read operations of the data are performed in accordance with the external command CMD from the CPU 36. In addition, for instance, it is possible that the operating state of the memory section 37 is switched to the normal operation state or the low power consumption mode in accordance with the external command CMD from the CPU 36, and that the operation of the memory section 37 is stopped or temporally restricted to reduce the power consumption with the low power consumption mode command based on the external command CMD from the CPU 36 when the memory section 37 is not used.

According to the present invention, when the booster power supply circuit stops the boosting operation, the clamp circuit clamps the second power supply voltage to the set value, so that the midpoint potential can be prevented from deviating largely to the second power supply voltage side and the ground potential side in the transition to the normal operation thereafter, and at the same time, the midpoint potential can be controlled appropriately so that the voltages over the respective capacitor withstand voltages are not applied to the capacitors, respectively. Accordingly, problems such as a destruction of the capacitor, a leak current increase and the like can be prevented from arising, so that reliability can be ensured.

In should be noted that any of the above-described embodiments are merely concrete examples to implement the present invention, and it is to be understood that the technical scope of the present invention will not be construed restrictive by these embodiments. In other words, the present invention can be realized in various forms without departing from the technological spirit and the main features thereof.

What is claimed is:

1. A semiconductor memory device comprising:
   a memory core section including a plurality of memory cells;
   a booster power supply circuit boosting a first power supply voltage to supply a second power supply voltage to the memory core section;
   first and second capacitors connected in series between a power supply line supplying the second power supply voltage from the booster power supply circuit and a ground;
   a bias generation circuit supplying a midpoint potential to a connection point of the first and second capacitors; and
   a clamp circuit reducing the second power supply voltage to a set value when the booster power supply circuit stops a boosting operation.

2. The semiconductor memory device according to claim 1, wherein the clamp circuit clamps the second power supply voltage to the set value in a low power consumption mode.

3. The semiconductor memory device according to claim 1, wherein the clamp circuit is a switching circuit connected between the power supply line supplying the second power supply voltage and the ground.

4. The semiconductor memory device according to claim 1, wherein the clamp circuit reduces the second power supply voltage to a ground potential.

5. The semiconductor memory device according to claim 2, wherein the clamp circuit includes a transistor connected to the power supply line supplying the second power supply voltage with a drain thereof and to the ground with a source thereof and a gate thereof is supplied with a signal indicating whether or not it is in the low power consumption mode.

6. The semiconductor memory device according to claim 2, wherein the clamp circuit includes a first transistor connected to the power supply line supplying the second power supply voltage with a drain and a gate thereof and a second transistor connected to a source of the first transistor with a drain thereof and to the ground with a source thereof and a gate thereof is supplied with a signal indicating whether or not it is in the low power consumption mode.

7. The semiconductor memory device according to claim 1, wherein the first and second capacitors are formed by using a memory cell capacitor, respectively.

8. The semiconductor memory device according to claim 1, wherein the midpoint potential is a potential being such the second power supply voltage as is voltage divided in accordance with a capacitance ratio between the first and second capacitors.

9. The semiconductor memory device according to claim 1, wherein the first and second capacitors have a same capacitance, and
   wherein the midpoint potential is a half (½) or substantially a half (½) of the potential of the second power supply voltage.

10. The semiconductor memory device according to claim 1, wherein the midpoint potential is a potential causing voltages applied to the first and second capacitors not to exceed respective withstand voltages of the first and second capacitors.

11. The semiconductor memory device according to claim 1, wherein a low power consumption mode state and a normal operation state can be switched in accordance with an external command inputted.

12. A semiconductor memory device comprising:
    a memory core section including a plurality of memory cells;
    a booster power supply circuit boosting a first power supply voltage to supply a second power supply voltage to the memory core section;
    a plurality of capacitors connected in series between a power supply line supplying the second power supply voltage from the booster power supply circuit and a ground;
    a bias generation circuit supplying a midpoint potential to connection point(s) of the capacitors connected in series; and
    a clamp circuit reducing the second power supply voltage to a set value in a low power consumption mode in which the booster power supply circuit stops a boosting operation.

13. The semiconductor memory device according to claim 12 wherein the clamp circuit is a switching circuit connected between the power supply line supplying the second power supply voltage and the ground.

14. The semiconductor memory device according to claim 12, wherein the clamp circuit includes a transistor connected to the power supply line supplying the second power supply voltage with a drain thereof and to the ground with a source thereof and a gate thereof is supplied with a signal indicating whether or not it is in the low power consumption mode.

15. The semiconductor memory device according to claim 12, wherein the clamp circuit includes a first transistor connected to the power supply line supplying the second power supply voltage with a drain and a gate thereof and a second transistor connected to a source of the first transistor with a drain thereof, to the ground with a source thereof and a gate thereof is supplied with a signal indicating whether or not it is in the low power consumption mode.

16. The semiconductor memory device according to claim 12,
wherein each of the plurality of capacitors is formed using a memory cell capacitor.

17. The semiconductor memory device according to claim 12,
wherein the midpoint potential suppressing voltage applied to each the capacitor to its withstand voltage or therebelow is supplied to each the connection point of the capacitors connected in series.

18. An electronic device comprising:

a semiconductor memory device including: a memory core section having a plurality of memory cells, a booster power supply circuit boosting a first power supply voltage to supply a second power supply voltage to the memory core section, a plurality of capacitors connected in series between a power supply line supplying the second power supply voltage from the booster power supply circuit and a ground, a bias generation circuit supplying a midpoint potential to connection point(s) of the capacitors, and a clamp circuit reducing the second power supply voltage to a set value in a low power consumption mode; and a control device inputting a command to the semiconductor memory device and capable of controlling an operating state of the semiconductor memory device with the command.

* * * * *